US009467175B2

(12) United States Patent
Chiang

(10) Patent No.: US 9,467,175 B2
(45) Date of Patent: Oct. 11, 2016

(54) DECODING METHOD, MEMORY STORAGE DEVICE AND MEMORY CONTROLLING CIRCUIT UNIT

(71) Applicant: PHISON ELECTRONICS CORP., Miaoli (TW)

(72) Inventor: Chih-Hsuan Chiang, Changhua County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 139 days.

(21) Appl. No.: 14/166,781

(22) Filed: Jan. 28, 2014

(65) Prior Publication Data

US 2015/0161002 A1   Jun. 11, 2015

(30) Foreign Application Priority Data

Dec. 9, 2013   (TW) .............................. 102145214 A

(51) Int. Cl.
| | |
|---|---|
| *H03M 13/00* | (2006.01) |
| *H03M 13/25* | (2006.01) |
| *H03M 13/09* | (2006.01) |
| *G06F 11/10* | (2006.01) |
| *H03M 13/11* | (2006.01) |
| *H03M 13/13* | (2006.01) |
| *G11B 20/18* | (2006.01) |
| *G11C 29/04* | (2006.01) |

(52) U.S. Cl.
CPC ........ *H03M 13/255* (2013.01); *G06F 11/1008* (2013.01); *G06F 11/1012* (2013.01); *H03M 13/09* (2013.01); *H03M 13/11* (2013.01); *H03M 13/13* (2013.01); *G11B 2020/185* (2013.01); *G11C 2029/0411* (2013.01); *G11C 2229/723* (2013.01)

(58) Field of Classification Search
CPC ........... G06F 11/1008; G06F 11/1076; G06F 11/1068; G06F 11/1044; H03M 13/11; H03M 13/09; H03M 13/091; H04L 1/0057; H04L 1/0061; G11C 7/1006
USPC .......................... 714/752, 758, 763, 786, 793
See application file for complete search history.

(56) References Cited

U.S. PATENT DOCUMENTS

| | | | | | |
|---|---|---|---|---|---|
| 5,226,043 | A | * | 7/1993 | Pughe, Jr. ........... | G06F 11/1016 714/768 |
| 8,291,283 | B1 | * | 10/2012 | Rad ..................... | H03M 13/036 714/752 |
| 8,862,970 | B1 | * | 10/2014 | Varnica .............. | H03M 13/1111 714/752 |
| 2006/0107179 | A1 | * | 5/2006 | Shen .................. | H03M 13/1111 714/758 |
| 2007/0124652 | A1 | * | 5/2007 | Litsyn ................ | G06F 11/1068 714/776 |
| 2008/0082868 | A1 | * | 4/2008 | Tran ................... | H03M 13/1117 714/699 |
| 2010/0031119 | A1 | * | 2/2010 | Lin .................... | H03M 13/1137 714/758 |

(Continued)

*Primary Examiner* — Albert Decady
*Assistant Examiner* — Osman M Alshack
(74) *Attorney, Agent, or Firm* — Jianq Chyun IP Office

(57) ABSTRACT

A decoding method for a parity check code, a memory storage device and a memory controlling circuit unit are provided. The decoding method includes: reading a codeword belonging to the parity check code from a rewritable non-volatile memory module, wherein the codeword includes message bits and first parity bits; performing an encoding procedure of the parity check code on the message bits to generate second parity bits; and generating a plurality of syndromes corresponding to the codeword according to the first parity bits and the second parity bits, wherein the syndromes are used to determine whether the codeword is a valid codeword. Accordingly, a complexity of a decoding circuit is decreased.

12 Claims, 5 Drawing Sheets

(56) References Cited

U.S. PATENT DOCUMENTS

| | | | |
|---|---|---|---|
| 2011/0119568 A1* | 5/2011 | Jeong | H03M 13/1185 714/790 |
| 2012/0260144 A1* | 10/2012 | Varanasi | H04L 1/0057 714/755 |
| 2013/0055050 A1* | 2/2013 | Uchikawa | G06F 11/1012 714/781 |
| 2014/0164867 A1* | 6/2014 | Kaynak | G06F 11/10 714/763 |
| 2014/0245098 A1* | 8/2014 | Sharon | G06F 11/1012 714/755 |

* cited by examiner

DECODING METHOD, MEMORY STORAGE DEVICE AND MEMORY CONTROLLING CIRCUIT UNIT

CROSS-REFERENCE TO RELATED APPLICATION

This application claims the priority benefit of Taiwan application serial no. 102145214, filed on Dec. 9, 2013. The entirety of the above-mentioned patent application is hereby incorporated by reference herein and made a part of this specification.

BACKGROUND

1. Technical Field

The invention relates to a decoding method, and more particularly, to a decoding method for a parity check code, a memory storage device and a memory controlling circuit unit using the same.

2. Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multi-media devices as cited above.

Generally, an encoding procedure of an error correcting code is first performed on a data before being written into the rewritable non-volatile memory module, and a decoding procedure is performed on the data after being read from the rewritable non-volatile memory module. A parity check matrix is used in error correcting codes of certain types for encoding or decoding. A size of the parity check matrix is greater when a length of a codeword gets greater, and a greater parity check matrix leads to increase in complexity of calculations related to matrix. Therefore, how to decrease the complexity of encoding or decoding is one of the major subjects for person skilled in the art.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

A decoding method for a parity check code, a memory storage device and a memory controlling circuit unit are provided, capable of decreasing complexity of a decoding circuit.

A decoding method for a parity check code is provided according to an exemplary embodiment of the invention, which includes: reading a codeword belonging to the parity check code from a rewritable non-volatile memory module, wherein the codeword comprises a plurality of first message bits and a plurality of first parity bits; performing an encoding procedure of the parity check code on the first message bits to generate second parity bits; and generating a plurality of syndromes corresponding to the codeword according to the first parity bits and the second parity bits, wherein the syndromes are used to determine whether the codeword is a valid codeword.

A memory storage device is provided according to an exemplary embodiment of the invention, which includes a connection interface unit, a rewritable non-volatile memory module and a memory control circuit unit. The connection interface unit is configured to couple to a host system. The rewritable non-volatile memory module includes a plurality of physical erasing units. The memory control circuit unit is coupled to the connection interface unit and the rewritable non-volatile memory module, and configured to read a codeword belonging to a parity check code from the rewritable non-volatile memory module. The codeword includes a plurality of first message bits and a plurality of first parity bits. The memory controlling circuit unit is also configured to perform an encoding procedure of the parity check code on the first message bits to generate a plurality of second parity bits, and generate a plurality of syndromes corresponding to the codeword according to the first parity bits and the second parity bits. The syndromes are used to determine whether the codeword is a valid codeword.

A memory controlling circuit unit is provided according to an exemplary embodiment of the invention, and configured to control a rewritable non-volatile memory module. The memory controlling circuit unit includes a host interface, a memory interface, a memory management circuit and an error checking and correcting circuit. The host interface is configured to couple to a host system. The memory interface is configured to couple to the rewritable non-volatile memory module. The memory management circuit is coupled to the host interface and the memory interface, and configured to read a codeword belonging to a parity check code from the rewritable non-volatile memory module. The codeword includes a plurality of first message bits and a plurality of first parity bits. The error checking and correcting circuit includes an encoding circuit and a decoding circuit. The encoding circuit is configured to perform an encoding procedure of the parity check code on the first message bits to generate a plurality of second parity bits. The decoding circuit is configured to generate a plurality of syndromes corresponding to the codeword according to the first parity bits and the second parity bits. The syndromes are used to determine whether the codeword is a valid codeword.

Based on above, in a decoding method, a memory storage device, a memory controlling circuit unit proposed according to the exemplary embodiments of the invention, since the encoding circuit may be used repeatedly, complexity of the decoding circuit may be decreased.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
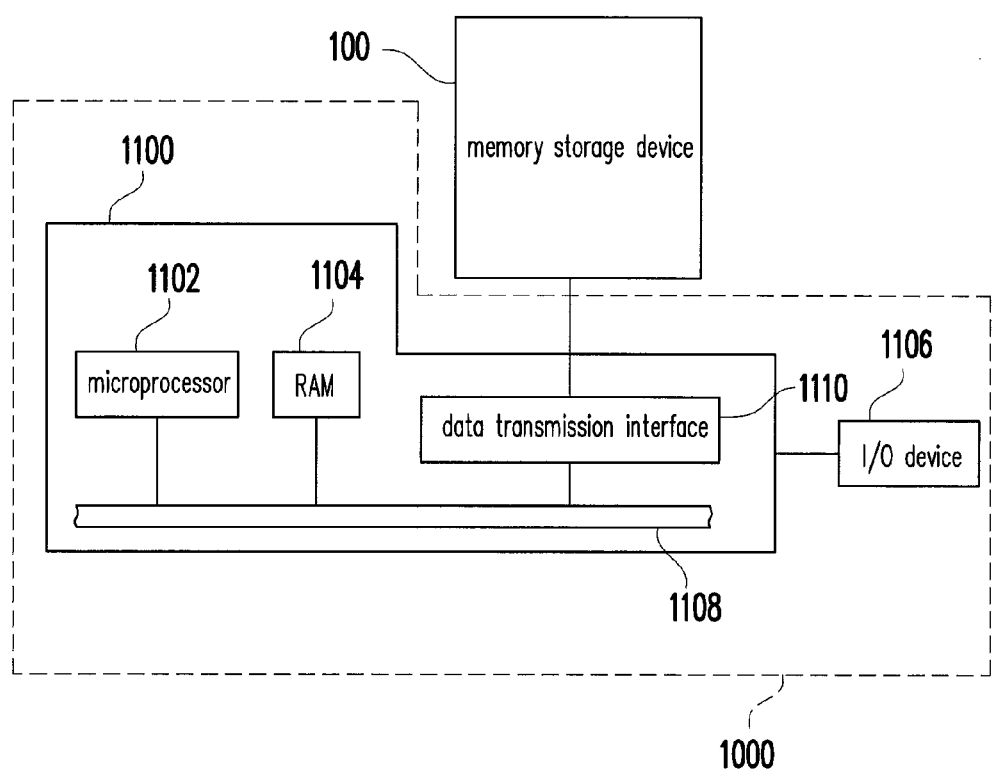
FIG. 1A illustrates a host system and a memory storage device according to an exemplary embodiment.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage device (also known as a memory storage system) includes a rewritable non-volatile memory module and a controller (also known as a control circuit). The memory storage device is usually configured together with a host system so that the host system may write data to or read data from the memory storage device.

Figure 1B:
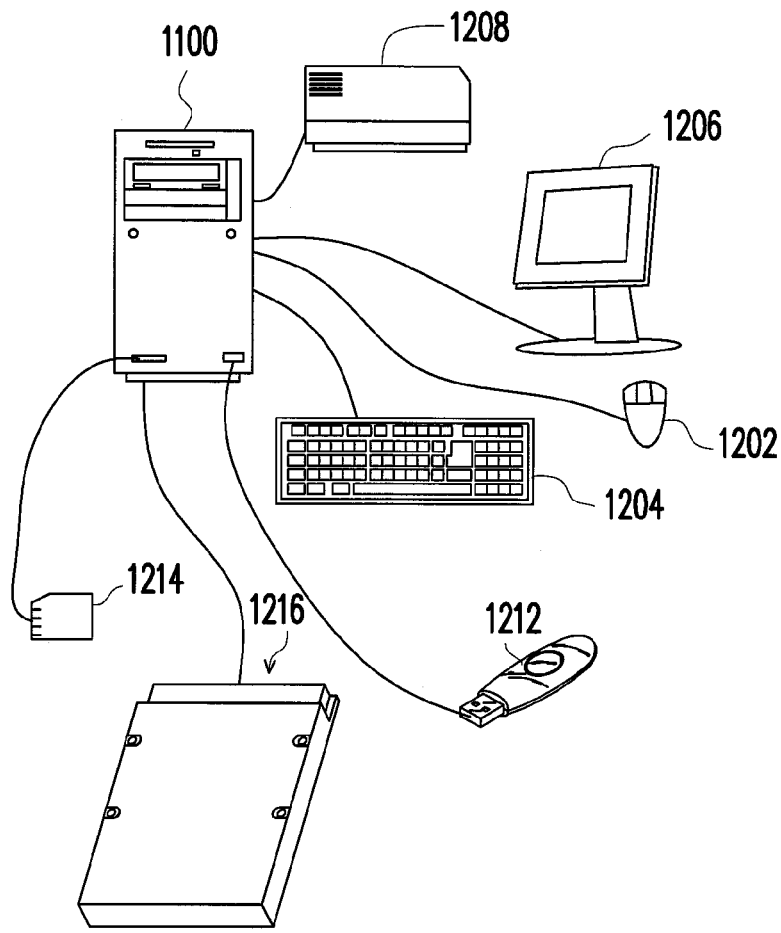
FIG. 1B is a schematic diagram illustrating a computer, an input/output device and a memory storage device according to an exemplary embodiment.
Figure 1C:
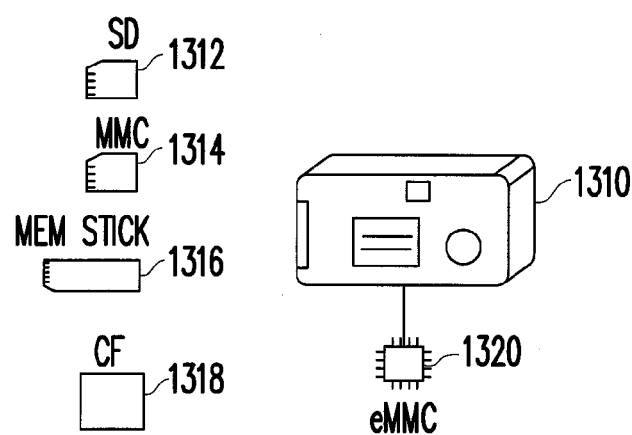
FIG. 1C is a schematic diagram illustrating a host system and a memory storage device according to an exemplary embodiment.

FIG. 1A illustrates a host system and a memory storage device according to an exemplary embodiment. FIG. 1B is a schematic diagram illustrating a computer, an input/output device and a memory storage device according to an exemplary embodiment. FIG. 1C is a schematic diagram illustrating a host system and a memory storage device according to an exemplary embodiment.

Referring to FIG. 1A, a host system 1000 includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206 and a printer 1208 as shown in FIG. 1B. It should be understood that the devices illustrated in FIG. 1B are not intended to limit the I/O device 1106, and the I/O device 1106 may further include other devices.

In the embodiment of the invention, the memory storage device 100 is coupled to other devices of the host system 1000 through the data transmission interface 1110. By using the microprocessor 1102, the random access memory (RAM) 1104 and the Input/Output (I/O) device 1106, data may be written into the memory storage device 100 or may be read from the memory storage device 100. For example, the memory storage device 100 may be a rewritable non-volatile memory storage device such as a flash drive 1212, a memory card 1214, or a solid state drive (SSD) 1216 as shown in FIG. 1B.

Generally, the host system 1000 may substantially be any system capable of storing data with the memory storage device 100. Although the host system 1000 is described as a computer system in the present exemplary embodiment, in another exemplary embodiment of the invention, the host system 1000 may be a digital camera, a video camera, a telecommunication device, an audio player, or a video player. For example, if the host system is a digital camera (video camera) 1310, the rewritable non-volatile memory storage device may be a SD card 1312, a MMC card 1314, a memory stick 1316, a CF card 1318 or an embedded storage device 1320 (as shown in FIG. 1C). The embedded storage device 1320 includes an embedded MMC (eMMC). It should be mentioned that the eMMC is directly coupled to a substrate of the host system.

Figure 2:
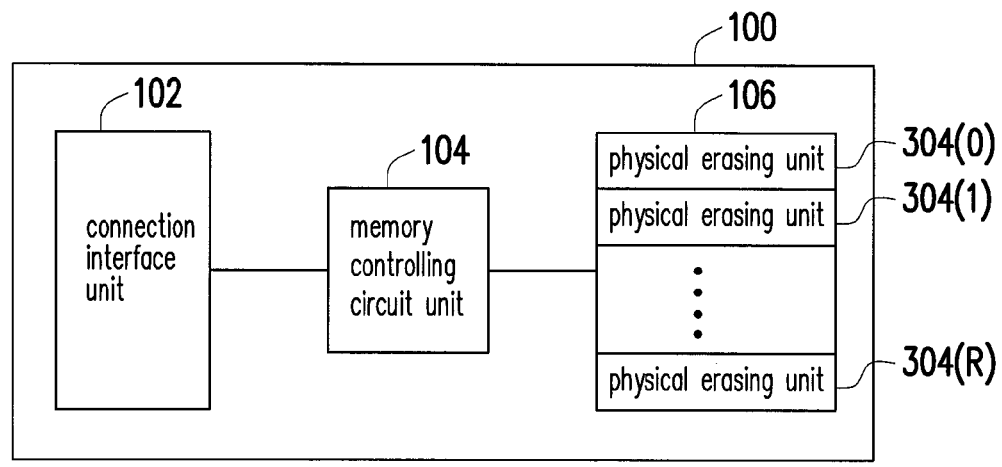
FIG. 2 is a schematic block diagram illustrating the memory storage device depicted in FIG. 1A.

FIG. 2 is a schematic block diagram illustrating the memory storage device depicted in FIG. 1A.

Referring to FIG. 2, the memory storage device 100 includes a connection interface unit 102, a memory controlling circuit unit 104 and a rewritable non-volatile memory storage module 106.

In the present exemplary embodiment, the connection interface unit 102 is compatible with a serial advanced technology attachment (SATA) standard. However, the invention is not limited thereto, and the connection interface unit 102 may also be compatible with a Parallel Advanced Technology Attachment (PATA) standard, an Institute of Electrical and Electronic Engineers (IEEE) 1394 standard, a peripheral component interconnect (PCI) Express interface standard, a universal serial bus (USB) standard, a secure digital (SD) interface standard, a Ultra High Speed-I (UHS-I) interface standard, a Ultra High Speed-II (UHS-II) interface standard, a memory sick (MS) interface standard, a multi media card (MMC) interface standard, an embedded MMC (eMMC) interface standard, a Universal Flash Storage (UFS) interface standard, a compact flash (CF) interface standard, an integrated device electronics (IDE) interface standard or other suitable standards. The connection interface unit 102 and the memory controlling circuit unit 104 may be packaged into one chip, or the connection interface unit 102 is distributed outside of a chip containing the memory controlling circuit unit 104.

The memory controlling circuit unit 104 is configured to execute a plurality of logic gates or control commands which are implemented in a hardware form or in a firmware form, so as to perform operations of writing, reading or erasing data in the rewritable non-volatile memory storage module 106 according to the commands of the host system 1000.

The rewritable non-volatile memory storage module 106 is coupled to the memory controlling circuit unit 104 and configured to store data written from the host system 1000. The rewritable non-volatile memory storage module 106 has multiple physical erasing units 304(0) to 304(R). For example, the physical erasing units 304(0) to 304(R) may belong to the same memory die or belong to different memory dies. Each physical erasing unit has a plurality of physical programming units, and the physical programming units of the same physical erasing unit may be written separately and erased simultaneously. For example, each physical erasing unit is composed by 128 physical programming units. Nevertheless, it should be understood that the invention is not limited thereto. Each physical erasing unit is composed by 64 physical programming units, 256 physical programming units or any amount of the physical programming units.

More specifically, each of the physical programming units includes a plurality of word lines and a plurality of bit lines, and a memory cell is disposed at an intersection of each of the word lines and each of the data lines. Each memory cell can store one or more bits. All of the memory cells in the same physical erasing unit are removed together. In the present exemplary embodiment, the physical erasing unit is a minimum unit for erasing. Namely, each physical erasing unit contains the least number of memory cells to be erased together. For instance, the physical erasing unit is a physical block. Furthermore, the memory cells on the same word line can be grouped into one or more of the physical programming units. In case each of the memory cells may store more than two bits, the physical programming units on the same word line may be classified into a lower physical programming unit and an upper physical programming unit. Generally, a writing speed of the lower physical programming unit is faster than a writing speed of the upper physical programming unit. In the present exemplary embodiment, the physical programming unit is a minimum unit for programming. That is, the physical programming unit is the minimum unit for writing data. For example, the physical programming unit is a physical page or a physical sector. In case the physical programming unit is the physical page, each physical programming unit usually includes a data bit area and a redundancy bit area. The data bit area has multiple physical sectors configured to store user data, and the redundant bit area is configured to store system data (e.g., an error correcting code). In the present exemplary embodiment, each of the data bit areas contains 32 physical sectors, and a size of each physical sector is 512-byte (B). However, in other exemplary embodiments, the data bit area may also include 8, 16, or more or less of the physical sectors, and amount and sizes of the physical sectors are not limited in the invention.

In the present exemplary embodiment, a rewritable non-volatile memory module 106 is a Multi Level Cell (MLC) NAND flash memory module which stores at least 2 bits in one cell. The rewritable non-volatile memory module 106 may also be a Single Level Cell (SLC) NAND flash memory module, a Trinary Level Cell (TLC) NAND flash memory module, other flash memory modules or any memory module having the same features.

Figure 3:
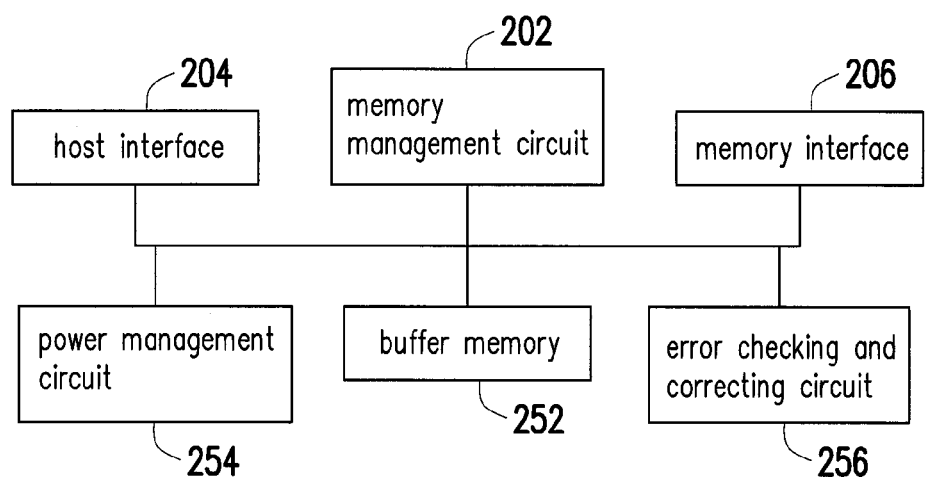
FIG. 3 is a schematic block diagram illustrating a memory controlling circuit unit according to an exemplary embodiment.

FIG. 3 is a schematic block diagram illustrating a memory controlling circuit unit according to an exemplary embodiment.

Referring to FIG. 3, the memory controlling circuit unit 104 includes a memory management circuit 202, a host interface 204 and a memory interface 206.

The memory management circuit 202 is configured to control overall operations of the memory controlling circuit unit 104. Specifically, the memory management circuit 202 has a plurality of control commands. When the memory storage device 100 operates, the control commands are executed to perform various operations such as data writing, data reading and data erasing. Operations of the memory management circuit 202 are similar to the operations of the memory controlling circuit unit 104, thus related description is omitted hereinafter.

In the present exemplary embodiment, the control commands of the memory management circuit 202 are implemented in a form of a firmware. For instance, the memory management circuit 202 has a microprocessor unit (not illustrated) and a ROM (not illustrated), and the control commands are burned into the ROM. When the memory storage device 100 operates, the control commands are executed by the microprocessor to perform operations of writing, reading or erasing data.

In another exemplary embodiment of the invention, the control commands of the memory management circuit 202 may also be stored as program codes in a specific area (for example, the system area in a memory exclusively used for storing system data) of the rewritable non-volatile memory module 106. In addition, the memory management circuit 202 has a microprocessor unit (not illustrated), a ROM (not illustrated) and a RAM (not illustrated). More particularly, the ROM has a boot code, which is executed by the microprocessor unit to load the control commands stored in the rewritable non-volatile memory module 106 to the RAM of the memory management circuit 202 when the memory controlling circuit unit 104 is enabled. Next, the control commands are executed by the microprocessor unit to perform operations of writing, reading or erasing data.

Further, in another exemplary embodiment of the invention, the control commands of the memory management circuit 202 may also be implemented in a form of hardware. For example, the memory management circuit 220 includes a microcontroller, a memory writing unit, a memory reading unit, a memory erasing unit and a data processing unit. The memory management unit, the memory writing unit, the memory reading unit, the memory erasing unit and the data processing unit are coupled to the microprocessor. The memory management unit is configured to manage the physical erasing units of the rewritable non-volatile memory module 106; the memory writing unit is configured to issue a writing command to the rewritable non-volatile memory module 106 in order to write data to the rewritable non-volatile memory module; the memory reading unit is configured to issue a reading command to the rewritable non-volatile memory module 106 in order to read data from the rewritable non-volatile memory module 106; the memory erasing unit is configured to issue an erase command to the rewritable non-volatile memory module 106 in order to erase data from the rewritable non-volatile memory module 106; the data processing unit is configured to process both the data to be written to the rewritable non-volatile memory module 106 and the data to be read from the rewritable non-volatile memory module 106.

The host interface 204 is coupled to the memory management circuit 202 and configured to receive and identify commands and data sent from the host system 1000. Namely, the commands and data sent from the host system 1000 are passed to the memory management circuit 202 through the host interface 204. In the present exemplary embodiment, the host interface 204 is compatible to a SATA standard. However, it should be understood that the present invention is not limited thereto, and the host interface 204 may also be compatible with a PATA standard, an IEEE 1394 standard, a PCI Express standard, a USB standard, a SD standard, a UHS-I standard, a UHS-II standard, a MS standard, a MMC standard, a eMMC standard, a UFS standard, a CF standard, an IDE standard, or other suitable standards for data transmission.

The memory interface 206 is coupled to the memory management circuit 202 and configured to access the rewritable non-volatile memory module 106. That is, data to be written to the rewritable non-volatile memory module 106 is converted to a format acceptable to the rewritable non-volatile memory module 106 through the memory interface 206.

In an exemplary embodiment of the invention, the memory controlling circuit unit 104 further includes a buffer memory 252, a power management circuit 254 and an error checking and correcting circuit 256.

The buffer memory 252 is coupled to the memory management circuit 202 and configured to temporarily store data and commands from the host system 1000 or data from the rewritable non-volatile memory module 106.

The power management unit 254 is coupled to the memory management circuit 202 and configured to control a power of the memory storage device 100.

The error checking and correcting circuit 256 is coupled to the memory management circuit 202 and configured to ensure an accuracy of data. Specifically, when the memory management circuit 202 receives a writing command from the host system 1000, the error checking and correcting circuit 256 may generate an error correcting code (ECC) for data corresponding to the writing command, and the memory management circuit 202 writes data and the ECC into the rewritable non-volatile memory module 106. Subsequently, when the data is read by the memory management circuit 202 from the rewritable non-volatile memory module 106, the corresponding ECC is also read, and the error checking and correcting circuit 256 may check or correct an error bit in the data according to the ECC. In the present exemplary embodiment, a parity check code is used by the error checking and correcting circuit 256. The parity check code may be any error correcting code that uses parity bits, such as a hamming code, a low density parity code (LDPC), or other error correcting codes using a parity check matrix. Processes of encoding and decoding are described in detail as follows.

The parity check code used by the error checking and correcting circuit 256 is corresponding to a parity check matrix for determining whether a codeword is a valid codeword. Specifically, a parity check matrix is marked as a matrix H and a codeword is marked as CW hereinafter. According to an equation (1) below, in case a result calculated by multiplying the parity check matrix H by the codeword CW is a zero vector, it indicates that the codeword CW is the valid codeword. It should be noted that, a matrix multiplication and a matrix addition as indicated in the present exemplary embodiment are matrix multiplication in mod 2 domain and matrix addition in mod 2 domain.

$$H \times CW^T = 0 \quad (1)$$

Therein, a dimension of the matrix H is m-by-n, and a dimension of the codeword CW is 1-by-n. Therein, m and n are positive integers. The codeword CW includes message bits and parity bits. Namely, the codeword CW may be represented by [M P], in which a vector M is constituted by the message bits, and a vector P is constituted by the parity bits. A dimension of the vector M is 1-by-(n–k), and a dimension of the vector P is 1-by-k, in which k is a positive integer. In other words, the codeword CW includes n bits, in which a length of the message bits is (n–k) bits, and a length of the parity bits is k bits. Similarly, the parity check matrix H includes a message part matrix (marked as $H_1$) and a parity part matrix (marked as $H_2$), namely, the parity check matrix H may be represented by [$H_1$ $H_2$]. Therein, a dimension of the message part matrix $H_1$ is m-by-(n–k), and a dimension of the parity part matrix $H_2$ is m-by-k. Therefore, the equation (1) may be re-written into an equation (2) below, so that the vector P may be calculated according to the vector M.

$$H_1 \times M^T + H_2 \times P^T = 0 \Rightarrow H_2 \times P^T \quad (2)$$
$$= H_1 \times M^T \Rightarrow P^T$$
$$= H_2^{-1} \times H_1 \times M^T$$

A generation matrix (marked as a matrix G) is generally used as a replacement for executing calculation of inverse matrix which is required in the equation (2), so as to satisfy an equation (3) below.

$$M \times G = [M P] \quad (3)$$

Therein, a dimension of the generation matrix G is (n–k)-by-n. However, persons skilled in the art should be able to understand that the generation matrix G may be obtained according to the parity check matrix H, thus detailed description is omitted hereinafter.

Figure 4:
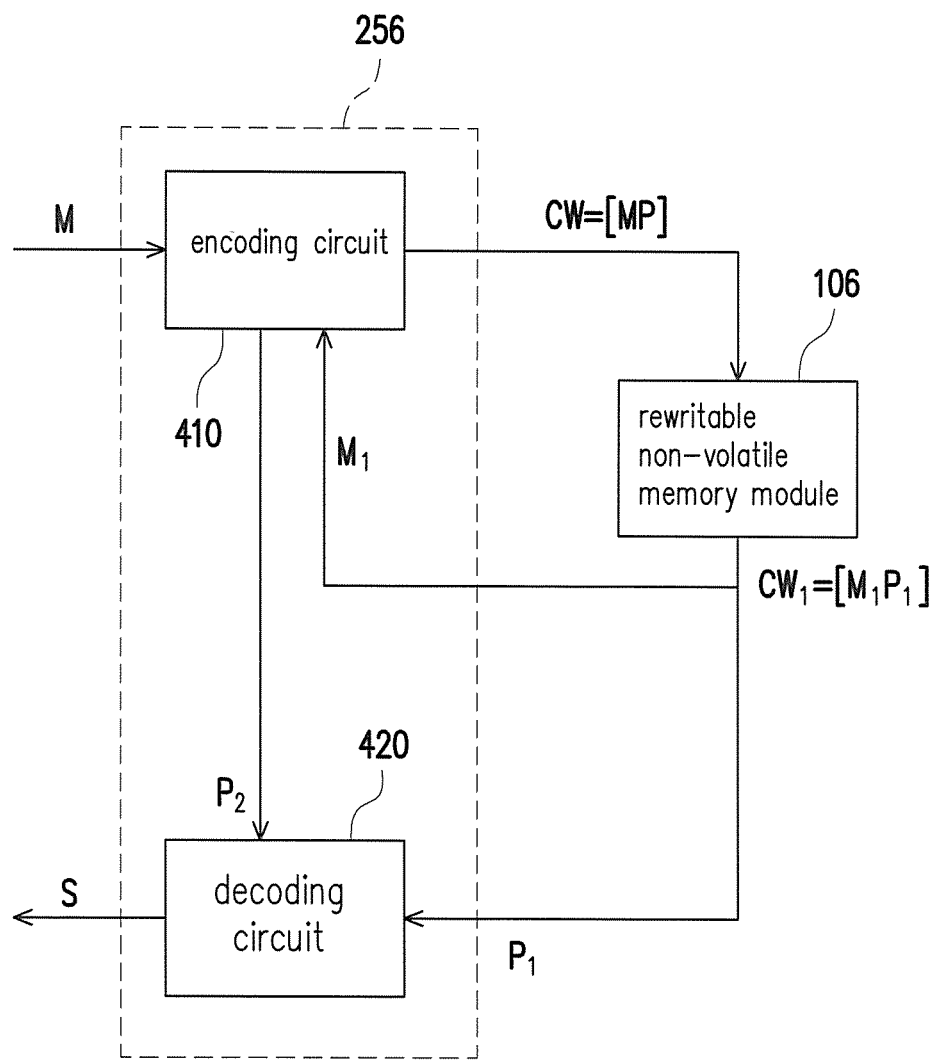
FIG. 4 illustrates a schematic diagram for encoding and decoding according to an exemplary embodiment.

FIG. 4 illustrates a schematic diagram for encoding and decoding according to an exemplary embodiment.

Referring to FIG. 4, the error checking and correcting circuit 256 includes an encoding circuit 410 and a decoding circuit 420. It is assumed that the memory management circuit 202 intends to write a plurality of message bits (also known as second message bits) into the rewritable non-volatile memory module 106. In this case, the encoding circuit 410 may multiply the vector M generated by the message bits by the generation matrix G to generate the codeword CW (as the equation (3) provided above), and the memory management circuit 202 may then write the codeword CW into the rewritable non-volatile memory module 106.

Subsequently, at one particular time point, the memory management circuit 202 receives a reading command from the host system 1000 for reading a logical address that belongs to the codeword CW. After the reading command is received, a codeword $CW_1$ may be read by the memory management circuit 202 from the rewritable non-volatile memory module 106. It should be noted that, the codeword $CW_1$ may include one or more error bits, so that the codeword $CW_1$ may be identical to or different from the codeword CW. The codeword $CW_1$ also includes message bits (also known as first message bits) and parity bits (also known as first parity bits), in which the message bits constitute a vector $M_1$ and the parity bits constitute a vector $P_1$. The vector $M_1$ is transmitted to the encoding circuit 410, and the encoding circuit 410 performs an encoding procedure belonging to a parity encoding on the vector $M_1$ to generate a plurality of parity bits (also known as second parity bits that constitute a vector $P_2$). The decoding circuit 420 receives the vector $P_1$ and the vector $P_2$, and generates a plurality of syndromes corresponding to the codeword $CW_1$ according to the vector $P_1$ and the vector $P_2$. The syndromes are used to determine whether the codeword $CW_1$ is the valid codeword, it indicates that the codeword $CW_1$ is the valid codeword if each of the syndromes is 0. In particular, the said syndromes are equivalent to syndromes generated by an equation (4) below (constituting a vector S).

$$H \times CW_1^T = S \quad (4)$$

A dimension of the vector S is m-by-1, namely, a length of the syndromes is m bits. In the present exemplary embodiment, a calculation of the equation (4) is simplified, so that the encoding circuit 410 may also be used in the decoding procedure for generating the syndromes, thereby decreasing complexity of the decoding circuit 420.

For instance, the encoding circuit 410 may multiply the vector $M_1$ by the generation matrix G to generate the vector $P_2$, so that the vector $M_1$ and the vector $P_2$ constitute a valid codeword. From another prospective, a calculation for the encoding circuit 410 to generate the vector $P_2$ may be represented by an equation (5) below. In other words, the result calculated by multiplying the parity check matrix H by the vector $[M_1\ P_2]$ may be the zero vector.

$$M_1 \times G = [M_1 P_2], s.t.\ H \times [M_1 P_2]^T = 0 \quad (5)$$

Furthermore, in case the parity check matrix H is divided into the message part matrix $H_1$ and the parity part matrix $H_2$, the equation (5) may be re-written into an equation (6) below, and the equation (4) may be re-written into an equation (7).

$$\begin{aligned} H \times [M_1 P_2]^T &= 0 \Rightarrow H_1 \times M_1^T + H_2 \times P_2^T \quad (6) \\ &= 0 \Rightarrow H_1 \times M_1^T \\ &= H_2 \times P_2^T \end{aligned}$$

$$S = H \times CW_1^T = H \times [M_1 P_1]^T = H_1 \times M_1^T + H_2 \times P_1^T \quad (7)$$

When the equation (6) is substituted into the equation (7), an equation (8) below is obtained accordingly.

$$S = H_2 \times P_2^T + H_2 \times P_1^T = H_2 \times (P_2 + P_1)^T \quad (8)$$

In other words, the decoding circuit 420 adds the vector $P_1$ generated by the first parity bits to the vector $P_2$ generated by the second parity bits to generate a first vector, and multiplies the parity part matrix $H_2$ by the first vector to generate the syndromes (the vector S being constituted) corresponding to the codeword $CW_1$. Accordingly, at least the decoding circuit 420 is not required to include circuits relating the message part matrix $H_1$.

Figure 5:
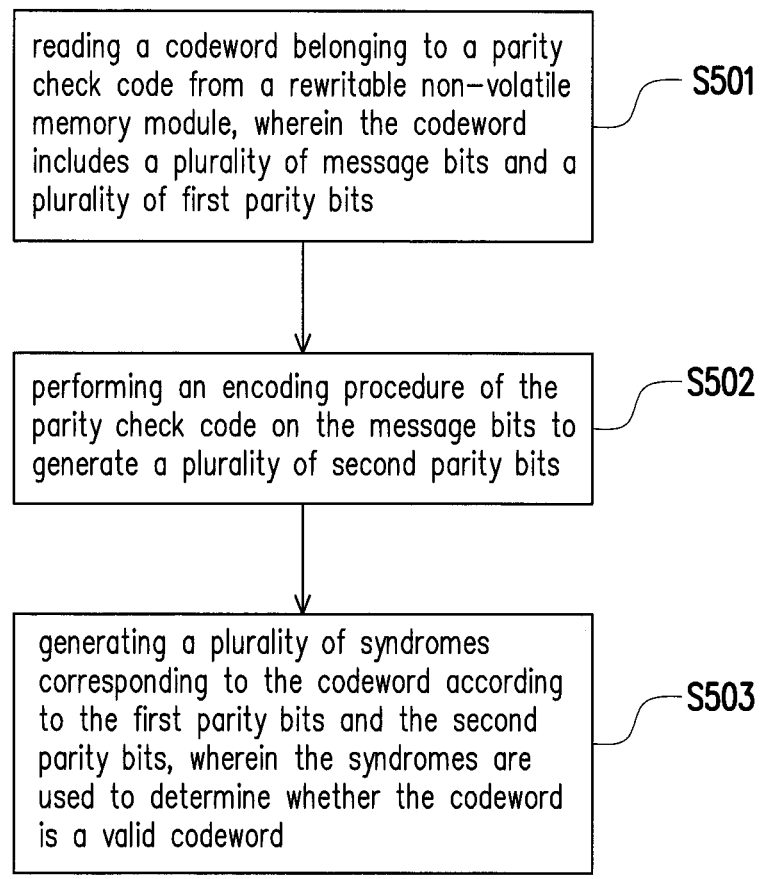
FIG. 5 is a flowchart illustrating a decoding method for a parity check code according to an exemplary embodiment.

FIG. 5 is a flowchart illustrating a decoding method for a parity check code according to an exemplary embodiment.

Referring to FIG. 5, in step S501, a codeword belonging to a parity check code is read from a rewritable non-volatile memory module 106, wherein the codeword includes a plurality of message bits and a plurality of first parity bits. In step S502, an encoding procedure of the parity check code is performed on the message bits to generate a plurality of second parity bits. In step S503, a plurality of syndromes corresponding to the codeword are generated according to the first parity bits and the second parity bits, wherein the syndromes are used to determine whether the codeword is a valid codeword.

Nevertheless, steps depicted in FIG. 5 are described in detail as above, thus related description is omitted hereinafter. It should be noted that, the steps depicted in FIG. 5 may be implemented as a plurality of program codes or circuits, and the invention is not limited thereto. Moreover, the method disclosed in FIG. 5 may be implemented with reference to above embodiments, or may be implemented independently, the invention is not limited thereto.

Based on above, in a decoding method, a memory storage device, a memory controlling circuit unit proposed according to the exemplary embodiments of the invention, the encoding circuit may be used repeatedly to generate the second parity bits. In addition, the first parity bits and the second parity bits (in stead of the message bits) may be used to generate the syndromes, so as to decrease complexity of the decoding circuit.

The previously described exemplary embodiments of the present invention have the advantages aforementioned, wherein the advantages aforementioned not required in all versions of the invention.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A decoding method for a parity check code, comprising:
    reading a codeword belonging to the parity check code from a rewritable non-volatile memory module, wherein the codeword comprises a plurality of first message bits and a plurality of first parity bits, and the parity check code corresponds to a parity check matrix and a generation matrix;
    performing an encoding procedure of the parity check code on the first message bits to generate a plurality of second parity bits; and
    generating a plurality of syndromes corresponding to the codeword according to the first parity bits and the second parity bits, wherein the syndromes are used to determine whether the codeword is a valid codeword,
    wherein the parity check matrix comprises a message part matrix and a parity part matrix, and the step of generating the syndromes corresponding to the codeword according to the first parity bits and the second parity bits comprises:
    adding a vector ($P_1$) generated by the first parity bits to a vector ($P_2$) generated by the second parity bits to generate a first vector; and
    multiplying the parity part matrix by the first vector to generate the syndromes (S) corresponding to the codeword,
    wherein the step of performing the encoding procedure of the parity check code on the first message bits to generate the second parity bits comprises: multiplying a vector ($M_1$) generated by the first message bits by the generation matrix to generate the second parity bits, so that a result generated by multiplying the parity check matrix by a vector ($M_1\ P_2$) constituted by the first message bits and the second parity bits is a zero vector.

2. The decoding method of claim 1, wherein before the step of reading to codeword, the decoding method further comprises:
    multiplying a vector (M) generated by a plurality of second message bits by the generation matrix to generate the codeword; and
    writing the codeword into the rewritable non-volatile memory module.

3. The decoding method of claim 1, wherein a dimension of the parity check matrix is m-by-n, a dimension of the message part matrix is m-by-(n–k), a dimension of the parity part matrix is m-by-k, wherein m, n and k are positive integers,
    wherein a length of the codeword is n bits, a length of the syndromes is m bits, and a length of the first parity bits is k bits.

4. The decoding method of claim 1, wherein the parity check code is a low density parity code.

5. A memory storage device, comprising:
a connection interface unit configured to couple to a host system;
a rewritable non-volatile memory module comprising a plurality of physical erasing units; and
a memory controlling circuit unit coupled to the connection interface unit and the rewritable non-volatile memory module, and configured to read a codeword belonging to a parity check code from the rewritable non-volatile memory module, wherein the codeword comprises a plurality of first message bits and a plurality of first parity bits, and the parity check code corresponds to a parity check matrix and a generation matrix,
wherein the memory controlling circuit unit is configured to perform an encoding procedure of the parity check code on the first message bits to generate a plurality of second parity bits, and generate a plurality of syndromes corresponding to the codeword according to the first parity bits and the second parity bits, wherein the syndromes are used to determine whether the codeword is a valid codeword,
wherein the parity check matrix comprises a message part matrix and a parity part matrix, and the operation of the memory controlling circuit unit generating the syndromes corresponding to the codeword according to the first parity bits and the second parity bits comprises:
the memory controlling circuit unit adding a vector ($P_1$) generated by the first parity bits to a vector ($P_2$) generated by the second parity bits to generate a first vector, and multiplying the parity part matrix by the first vector to generate the syndromes (S) corresponding to the codeword,
wherein the operation of the memory controlling circuit unit performing the encoding procedure of the parity check code on the first message bits to generate the second parity bits comprises: the memory controlling circuit unit multiplying a vector ($M_1$) generated by the first message bits by the generation matrix to generate the second parity bits, so that a result generated by multiplying the parity check matrix by a vector ($M_1$ $P_2$) constituted by the first message bits and the second parity bits is a zero vector.

6. The memory storage device of claim 5, wherein the memory controlling circuit unit is further configured to multiply a vector (M) generated by a plurality of second message bits by the generation matrix to generate the codeword, and write the codeword into the rewritable non-volatile memory module.

7. The memory storage device of claim 5, wherein a dimension of the parity check matrix is m-by-n, a dimension of the message part matrix is m-by-(n−k), a dimension of the parity part matrix is m-by-k, wherein m, n and k are positive integers,
wherein a length of the codeword is n bits, a length of the syndromes is m bits, and a length of the first parity bits is k bits.

8. The memory storage device of claim 5, wherein the parity check code is a low density parity code.

9. A memory controlling circuit unit, configured to control a rewritable non-volatile memory module, and the memory controlling circuit unit comprises:
a host interface configured to couple to a host system;
a memory interface configured to couple to the rewritable non-volatile memory module;
a memory management circuit coupled to the host interface and the memory interface, and configured to read a codeword belonging to a parity check code from the rewritable non-volatile memory module, wherein the codeword comprises a plurality of first message bits and a plurality of first parity bits, and the parity check code corresponds to a parity check matrix and a generation matrix, and
an error checking and correcting circuit comprising an encoding circuit and a decoding circuit,
wherein the encoding circuit is configured to perform an encoding procedure of the parity check code on the first message bits to generate a plurality of second parity bits,
wherein the decoding circuit is configured to generate a plurality of syndromes corresponding to the codeword according to the first parity bits and the second parity bits, wherein the syndromes are used to determine whether the codeword is a valid codeword,
wherein the parity check matrix comprises a message part matrix and a parity part matrix, and the operation of the decoding circuit generating the syndromes corresponding to the codeword according to the first parity bits and the second parity bits comprises:
the decoding circuit adding a vector ($P_1$) generated by the first parity bits to a vector ($P_2$) generated by the second parity bits to generate a first vector, and multiplying the parity part matrix by the first vector to generate the syndromes (S) corresponding to the codeword,
wherein the encoding circuit is configured to multiply a vector ($M_1$) generated by the first message bits by the generation matrix to generate the second parity bits, so that a result generated by multiplying the parity check matrix by a vector ($M_1$ $P_2$) constituted by the first message bits and the second parity bits is a zero vector.

10. The memory controlling circuit unit of claim 9, wherein the encoding circuit is further configured to multiply a vector (M) generated by a plurality of second message bits by the generation matrix to generate the codeword, and the memory management circuit is further configured to write the codeword into the rewritable non-volatile memory module.

11. The memory controlling circuit unit of claim 9, wherein a dimension of the parity check matrix is m-by-n, a dimension of the message part matrix is m-by-(n−k), a dimension of the parity part matrix is m-by-k, wherein m, n and k are positive integers,
wherein a length of the codeword is n bits, a length of the syndromes is m bits, and a length of the first parity bits is k bits.

12. The memory controlling circuit unit of claim 9, wherein the parity check code is a low density parity code.

* * * * *